United States Patent
Gale et al.

(10) Patent No.: US 8,855,951 B2
(45) Date of Patent: Oct. 7, 2014

(54) POWER DISTRIBUTION CIRCUIT DIAGNOSTIC SYSTEM AND METHOD

(75) Inventors: Allan Roy Gale, Livonia, MI (US);
Michael W. Degner, Novi, MI (US);
Larry Dean Elie, Ypsilanti, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 988 days.

(21) Appl. No.: 12/759,291

(22) Filed: Apr. 13, 2010

(65) Prior Publication Data
US 2011/0166809 A1   Jul. 7, 2011

(51) Int. Cl.
*G01R 31/00* (2006.01)
*G01R 15/00* (2006.01)
*G01R 19/00* (2006.01)
*G01R 27/00* (2006.01)

(52) U.S. Cl.
CPC ................................. *G01R 31/007* (2013.01)
USPC ................ 702/58; 702/57; 702/59; 702/64; 702/65

(58) Field of Classification Search
USPC ................................. 702/57–59, 64, 65, 117
See application file for complete search history.

(56) References Cited

U.S. PATENT DOCUMENTS

| | | | |
|---|---|---|---|
| 4,345,342 A | 8/1982 | Saito | |
| 6,525,543 B1 | 2/2003 | Roberts et al. | |
| 7,573,150 B2 | 8/2009 | Hirasawa | |
| 2002/0125895 A1 | 9/2002 | Awaji | |
| 2003/0048007 A1 | 3/2003 | Mercier et al. | |
| 2004/0155624 A1 | 8/2004 | Amano et al. | |
| 2004/0162696 A1* | 8/2004 | Kumar | 702/132 |
| 2004/0169489 A1 | 9/2004 | Hobbs | |
| 2004/0251875 A1 | 12/2004 | Kinoshita et al. | |
| 2005/0269880 A1 | 12/2005 | Konishi | |

(Continued)

FOREIGN PATENT DOCUMENTS

CN         201352246 Y       11/2009

OTHER PUBLICATIONS

James P. Noon et al., UC3855A/B High Performance Power Factor Preregulator, Unitrode Corporation, U-153, pp. 1-20, 1999.

(Continued)

*Primary Examiner* — Janet Suglo
(74) *Attorney, Agent, or Firm* — David B. Kelley; Brooks Kushman P.C.

(57) ABSTRACT

A diagnostic system for a power distribution circuit including a line, neutral and ground may include a switch configured to electrically connect the line and neutral, a first sensor configured to sense a line to neutral electrical parameter, and a second sensor configured to sense a neutral to ground electrical parameter. The system may also include a processor configured to close the switch, to observe at least some of the sensed electrical parameters before and after the switch is closed, and to identify a fault condition in the line or neutral based on the observed electrical parameters.

14 Claims, 1 Drawing Sheet

(56) References Cited

U.S. PATENT DOCUMENTS

| | | |
|---|---|---|
| 2008/0002322 A1 | 1/2008 | Hirasawa |
| 2008/0218121 A1 | 9/2008 | Gale et al. |
| 2008/0311877 A1 | 12/2008 | Darshan |
| 2009/0102433 A1 | 4/2009 | Kamaga |
| 2009/0198459 A1* | 8/2009 | Bilac et al. ............. 702/58 |
| 2010/0019734 A1 | 1/2010 | Oyobe et al. |
| 2010/0131137 A1 | 5/2010 | Iida |
| 2010/0134065 A1 | 6/2010 | Iida |
| 2010/0188051 A1 | 7/2010 | Yamazaki et al. |
| 2010/0194354 A1 | 8/2010 | Gotou et al. |
| 2010/0198440 A1 | 8/2010 | Fujitake |
| 2010/0231174 A1 | 9/2010 | Li et al. |
| 2010/0253145 A1 | 10/2010 | King et al. |
| 2010/0259227 A1 | 10/2010 | Gale et al. |
| 2011/0084548 A1 | 4/2011 | Gale et al. |
| 2011/0127956 A1 | 6/2011 | Mitsutani |

OTHER PUBLICATIONS

Yijing Chen, et al., Control of a Single-Phase PFC Preregulataor [sic] Using an 8-Bit Microcontroller, pp. 1454-1460, 1-2422-0714-1/07, IEEE.

James P. Noon, A 250kHz, 500W Power Factor Correction Circuit Employing Zero Voltage Transitions, Unitrode Corporation, pp. 1-1 to 1-16, Oct. 1994, Texas Instruments Incorporated.

* cited by examiner

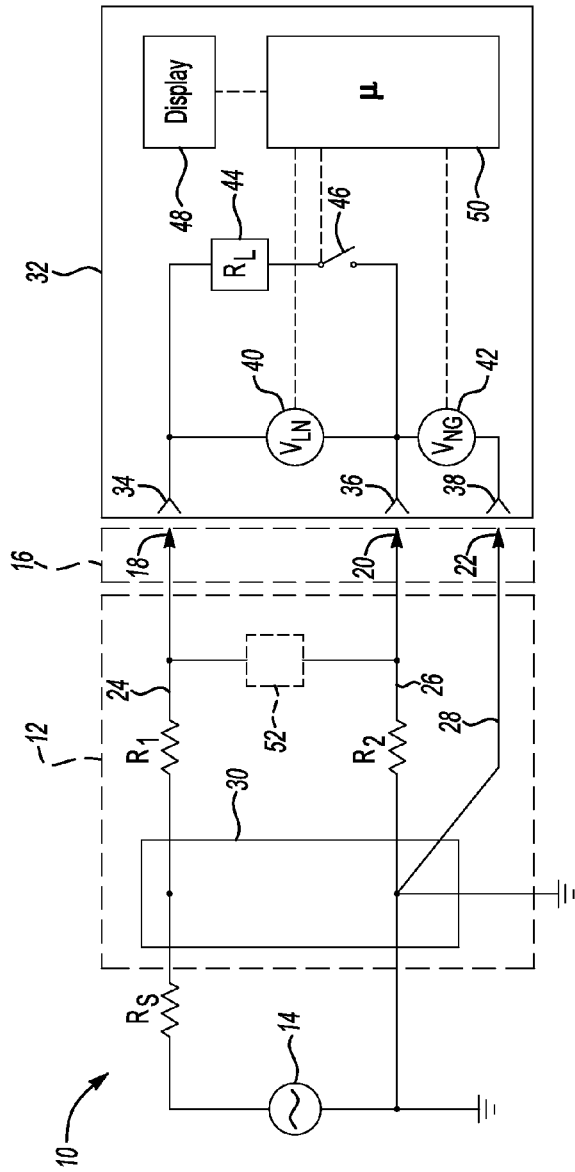
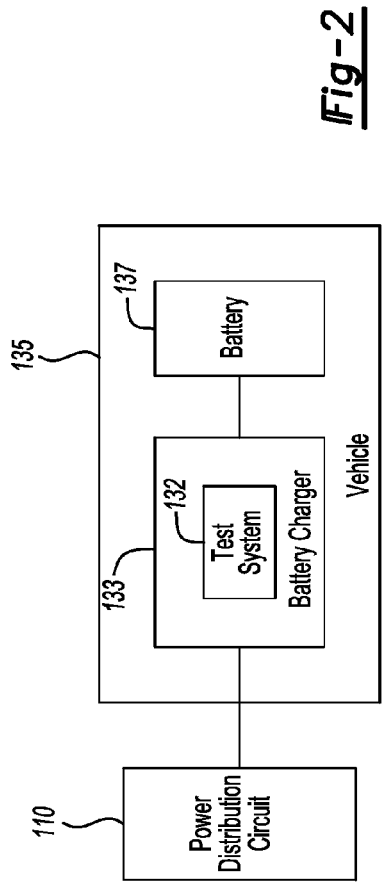

POWER DISTRIBUTION CIRCUIT DIAGNOSTIC SYSTEM AND METHOD

BACKGROUND

Residential homes and commercial buildings are typically wired to provide electrical power via electrical outlets. Inspecting this wiring to identify faults may be time-consuming, expensive and/or impractical depending on the extent or layout of the wiring.

Existing diagnostic units may electrically connect a light source across the line to neutral, line to ground, and neutral to ground of a power distribution circuit. If properly wired, the light source turns on when connected across the line to neutral or line to ground. If improperly wired, the light source turns on when connected across the neutral to ground.

SUMMARY

A power distribution circuit including a line, neutral and ground may be characterized by first collecting line to neutral voltage information or line to neutral current information, and collecting neutral to ground voltage information or neutral to ground current information. At least one of a length of the neutral, a gauge of the neutral, and a fault condition in the line or neutral may then be determined based on the collected information.

BRIEF DESCRIPTION OF THE DRAWINGS

FIG. 1 is a schematic diagram of an example power distribution circuit and an embodiment of a power distribution circuit test system.

FIG. 2 is a block diagram of an embodiment of a vehicle.

Like numerals of FIGS. 1 and 2 may share similar, although not necessarily identical, descriptions. As an example, numbered elements 10, 110 may share similar descriptions.

DETAILED DESCRIPTION

Referring to FIG. 1, an example power distribution circuit 10 for a building 12 is arranged in a known fashion to supply power from a power source 14 via an electrical outlet 16. The electrical outlet 16 includes a line terminal 18, a neutral terminal 20 and a ground terminal 22. The terminals 18, 20, 22 are respectively electrically connected with a line 24, a neutral 26 and a ground 28. The line 24 and neutral 26 are electrically connected with the power source 14 via a fuse box 30. Of course, other arrangements are also possible.

The power source 14 has an associated resistance, $R_S$, the line 24 has an associated resistance, $R_1$, and the neutral 26 has an associated resistance, $R_2$.

An embodiment of a power distribution test system 32 may include a line terminal 34, a neutral terminal 36 and a ground terminal 38. The terminals 34, 36, 38 may be arranged as a plug to be plugged into the electrical outlet 16. A voltage sensor 40 is electrically connected between the terminals 34, 36, and may thus sense the voltage drop from the line 24 to the neutral 26 (a line to neutral electrical parameter). Another voltage sensor 42 is electrically connected between the terminals 36, 38, and may thus sense the voltage drop from the neutral 26 to the ground 28 (a neutral to ground electrical parameter). A load 44 having a known resistance, $R_L$, and a switch 46 are also electrically connected in series between the terminals 34, 36.

Alternatively, current sensors may be used. For example, a current sensor (not shown) may be electrically connected between the terminal 34 and load 44 to sense the current through the line 24 and neutral 26 (a line to neutral electrical parameter); a current sensor (not shown) and an associated voltage source (not shown) may be electrically connected between the terminals 36, 38 to sense the current through the neutral 26 and ground 28 (a neutral to ground electrical parameter), etc.

The test system 32 may also include a display 48, and microprocessor 50 in communication and/or operative control with the sensors 40, 42, the switch 46, and the display 48.

In certain embodiments, the test system 32 may be arranged as a wall wart to provide stand-alone diagnostic capability. Referring to FIG. 2, the test system 132, in other embodiments, may be integrated (or operatively arranged) with an on-board (or off-board) battery charger 133 of a vehicle 135 to analyze the power distribution circuit 110 before charging the vehicle's battery 137. Other arrangements and scenarios are also possible.

As explained in more detail below, the microprocessor 50 may analyze characteristics of the power distribution circuit 10 based on the voltages reported by the sensors 40, 42 (and/or currents as the case may be). For example, the test system 10 may determine whether there is an additional load 52 electrically connected between the line 24 and neutral 26, determine whether there is a fault in the line 24 or neutral 26, determine the length of the neutral 26 and/or determine the gauge of the neutral 26. This analysis and/or fault identification may, for example, be reported via the display 48, stored in memory for later access, or transmitted via a suitable wireless/wired transmission system (not shown).

Additional Load on Circuit

To determine whether there is another load 52 on the power distribution circuit 10, the microprocessor 50 may determine $V_{LN@t=0}$ (the line to neutral voltage drop before the switch 46 is closed) and $V_{NG@t=0}$ (the neutral to ground voltage drop before the switch 46 is closed) based on information from the sensors 40, 42 respectively. The microprocessor 50 may then cause the switch 46 to close and determine $V_{LN@t=1}$ and $V_{NG@t=1}$ (respectively, the line to neutral and neutral to ground voltage drops after the switch 46 is closed) based on information from the sensors 40, 42. Next, the microprocessor 50 may determine the current, I, through the line 24 and neutral 26 as well as the resistance, $R_2$, associated with the neutral 26 via the following relationships $$I = V_{LN@t=1}/R_L \qquad (1)$$

$$R_2 = (V_{NG@t=1} - V_{NG@t=0})/I \qquad (2)$$

Finally, the microprocessor 50 may determine the current, $I_{al}$, associated with the load 52 (if present) via the following relationship $$I_{al} = V_{NG@t=0}/R_2 \qquad (3)$$

An $I_{al}$ greater than some predetermined threshold value may indicate that a load 52 of significance is present on the power distribution circuit 10. A threshold value greater than σ (0.1 A for example) may be used to account for errors in the above process, and may be based on testing, simulation, etc.

Length of Neutral Wiring

To determine the length, L, of the neutral wire 26, the microprocessor 50 may first retrieve resistance per length information, $β_G$, from, for example, a table stored in memory for various wire gauges. The microprocessor 50 may then determine the length, L, associated with each gauge via the following relationship $$L = R_2/β_G \qquad (4)$$

If the wire gauge is already known or otherwise determined, the microprocessor 50 may need only to retrieve resistance per length information for that particular gauge.

If it is assumed that $R_1 \approx R_2$, the length of the line wire 24 may be approximately equal to the length, L, of the neutral wire 26.

Gauge of Neutral Wiring

To determine the gauge, G, of the neutral wire 26, the microprocessor 50 may first determine $R_2$ at two instances of time (e.g., $R_{2@t}$, $R_{2@t+250}$; that is, two $R_2$ values that are 250 seconds apart. Other time periods, however, may also be used) via (2). The microprocessor 50 may then determine a change in wire temperature based on the following relationship $$\Delta T = (R_{2@t+250} - R_{2@t}) / (\alpha * R_{2@t}) \quad (5)$$

where $\alpha$ is the temperature coefficient of the metal used in the wire (assumed to be copper). This change in temperature, $\alpha T$, may be used to determine the mass, m, of the neutral wiring 26 based on the following relationship $$m = Q_w / (c * \Delta T) \quad (6)$$

where c is the specific heat capacity that is a material (in this example, copper) specific constant and $Q_w$ is the energy stored in the wire:

$$Q_w = \int (I^2 * R_2) dt - Q_{rejected} \quad (7)$$

where $Q_{rejected}$ is any heat transferred from the wire to the surroundings. This term is assumed to be positive.

The mass, m, of the neutral wiring 26 may also be determined based on the following relationship $$m = \zeta * A * L \quad (8)$$

where $\zeta$ is the density of the wire, and A and L are the cross-sectional area and length of the wire respectively. The cross-sectional area is necessarily known for a given gauge. The length is determined via (4) for a given gauge.

Respective masses may be determined via (8) for each potential gauge. Each of these masses may be compared with the mass determined via (6). By assuming $Q_{rejected} \geq 0$, the gauge yielding a mass equal to or less than the mass determined via (6) may be assumed to be the gauge for the neutral wire 26. As an example, if the mass is found to be 6 kg via (6), and is found to be 8 kg for 12 gauge via (8) and 5 kg for 14 gauge via (8), the gauge of the neutral 26 may be assumed to be 14 gauge, the smaller of the two. This may offer the advantage of selecting the wire with the lower rated current capacity when determining the maximum safe current capacity of the circuit.

Fault in Line and/or Neutral

To determine whether there is a fault in the line 24 and/or neutral 26, the microprocessor 50 may examine the resistance, $R_S$, associated with the power source 14. As this resistance is not directly measured, the microprocessor 50 may be determine it via the following relationships $$V_{LN@t=1} - V_{LN@t=0} = I * (R_1 + R_2 + R_L + R_S) \quad (9)$$

rearranging (9) to yield (10)

$$R_1 + R_S = ((V_{LN@t=1} - V_{LN@t=0}) / I) - (R_2 + R_L) \quad (10)$$

$$R_S = (R_1 + R_S) - R_2 \text{ (assuming } R_1 \approx R_2) \quad (11)$$

Assuming that the typically industry-stated average of 95% of the power supplied by the power source 14 reaches the electrical outlet 16, and that the test system 32 presents a load of 6 A (i.e., $R_L = 20\Omega$ at 120 V) to the power distribution circuit 10, 720 W (120 V*6 A) should be consumed by the test system 32. In order for the power source 14 to provide 720 W, however, it needs to produce 758 W (720 W/0.95). As apparent to those of ordinary skill $$P = I^2 * R_S \quad (12)$$

In this example, $R_S = 1\Omega$ (P=38 W, I=6 A). Similarly, if the test system 32 presents a load of 12 A to the power distribution circuit 10, $R_S = 0.5\Omega$. Because the load presented by the test system 32 is known, the microprocessor 50 may determine reasonable values for $R_S$.

If from (11) the microprocessor 50 finds $R_S$ to be negative (or small relative to its expected value), the microprocessor 50 may report via the display 48 a potential fault condition, such as a loose connection, broken wire, etc., within the neutral 26. (Under normal circumstances, $R_1 \approx R_2$. A negative $R_S$ would indicate that $R_2 > R_1 + R_S$.) If from (11) the microprocessor 50 finds $R_S$ to be large relative to its expected value, the microprocessor 50 may report via the display 48 a potential fault condition within the line 24. (A relatively large $R_S$ may indicate that $R_1 >> R_2$.)

Referring to (5) and (6), those of ordinary skill will recognize that the large long wires typically used between the power source 14 and fuse box 30 will experience an insignificant temperature rise due to the current through $R_L$, so any change in $R_S$ will be due to changes in $R_1$ and $R_2$.

The microprocessor 50 may also examine if the determined value of $R_S$ changes significantly over time to identify a potential fault condition within the line 24 or neutral 26. A wire's resistance increases as it heats up. According to (11), if the line 24 and neutral 26 are heating up at approximately the same rate, $R_S$ will remain relatively constant. If the line 24 is heating up much faster than the neutral 26 (once the switch 46 has been closed) because of a fault within the line 24, $R_S$ will increase in value (because $R_1$ will increase in value faster than $R_2$). If the neutral 26 is heating up much faster than the line 24 because of a fault within the neutral 26, $R_S$ will decrease in value (because $R_2$ will increase in value faster than $R_1$).

As apparent to those of ordinary skill, the algorithms disclosed herein may be deliverable to a processing device, which may include any existing electronic control unit or dedicated electronic control unit, in many forms including, but not limited to, information permanently stored on non-writable storage media such as ROM devices and information alterably stored on writeable storage media such as floppy disks, magnetic tapes, CDs, RAM devices, and other magnetic and optical media. The algorithms may also be implemented in a software executable object. Alternatively, the algorithms may be embodied in whole or in part using suitable hardware components, such as Application Specific Integrated Circuits (ASICs), state machines, controllers or other hardware components or devices, or a combination of hardware, software and firmware components.

While embodiments of the invention have been illustrated and described, it is not intended that these embodiments illustrate and describe all possible forms of the invention. The words used in the specification are words of description rather than limitation, and it is understood that various changes may be made without departing from the spirit and scope of the invention.

What is claimed:

1. A diagnostic system for a power distribution circuit including a line, neutral and ground comprising:
   a switch configured to electrically connect the line and neutral;
   a first sensor configured to sense a line to neutral electrical parameter;

a second sensor configured to sense a neutral to ground electrical parameter; and a processor configured to close the switch, to observe at least some of the sensed electrical parameters before and after the switch is closed, and to identify a fault condition in the line or neutral based on the observed electrical parameters.

2. The system of claim 1 wherein the processor is further configured to determine a length of the neutral based on the observed electrical parameters.

3. The system of claim 1 wherein the processor is further configured to determine a gauge of the neutral based on the observed electrical parameters.

4. The system of claim 1 wherein the line to neutral electrical parameter is a voltage across the line to neutral or a current through the line and neutral.

5. The system of claim 1 wherein the neutral to ground electrical parameter is a voltage across the neutral to ground or a current through the neutral to ground.

6. The system of claim 1 wherein the processor is further configured to determine whether a load is electrically connected with the line and neutral based on the observed electrical parameters.

7. A method for characterizing a power distribution circuit including a line, neutral and ground comprising:
by at least one processor,
closing a switch electrically connecting the line and neutral,
collecting line to neutral voltage information or line to neutral current information for a period of time including a time immediately before the switch is closed and a time immediately after the switch is closed,
collecting neutral to ground voltage information or neutral to ground current information, and
determining at least one of a length of the neutral, a gauge of the neutral, and a fault condition in the line or neutral based on the collected information.

8. The method of claim 7 further comprising determining whether a load is electrically connected with the line and neutral based on the collected information.

9. A diagnostic system comprising:
a vehicle including
a plurality of sensors configured to sense an electrical parameter of a line and neutral and an electrical parameter of a neutral and ground, and
a processor configured to close a switch configured to electrically connect the line and neutral, and identify a fault for the line or neutral based on the sensed parameters, some of the sensed parameters being sensed before and after the switch is closed.

10. The system of claim 9 wherein the processor is further configured to determine a length of the neutral based on the sensed parameters.

11. The system of claim 9 wherein the processor is further configured to determine a gauge of the neutral based on the sensed parameters.

12. The system of claim 9 wherein the electrical parameter of the line and neutral is a voltage across the line and neutral or a current through the line and neutral.

13. The system of claim 9 wherein the electrical parameter of the neutral and ground is a voltage across the neutral and ground or a current through the neutral and ground.

14. The system of claim 9 wherein the processor is further configured to determine whether a load is electrically connected with the line and neutral based on the sensed electrical parameters.

* * * * *